(12) United States Patent
Brändle et al.

(10) Patent No.: US 6,492,011 B1
(45) Date of Patent: Dec. 10, 2002

(54) WEAR-RESISTANT WORKPIECE AND METHOD FOR PRODUCING SAME

(75) Inventors: Hans Brändle, Sargans (CH); Nobuhiko Shima, Chiba-Ken (JP)

(73) Assignee: Unaxis Trading AG, Trubbach (LI)

( * ) Notice: Subject to any disclaimer, the term of this patent is extended or adjusted under 35 U.S.C. 154(b) by 0 days.

(21) Appl. No.: 09/145,594

(22) Filed: Sep. 2, 1998

(51) Int. Cl.$^7$ ................................. B23B 27/14
(52) U.S. Cl. ................. 428/217; 428/212; 428/216; 428/336; 428/472; 428/697; 428/698; 428/699; 407/119; 51/307; 51/309
(58) Field of Search ................. 428/336, 657, 428/698, 699, 216, 472, 704, 217; 51/307, 309; 407/119

(56) References Cited

U.S. PATENT DOCUMENTS

| | | | | |
|---|---|---|---|---|
| 4,237,184 A | * | 12/1980 | Gonesth et al. | 428/336 |
| 4,556,607 A | * | 12/1985 | Sastri | 428/627 |
| 4,599,281 A | * | 7/1986 | Schintlmeister et al. | 428/699 |
| 4,746,563 A | * | 5/1988 | Nakano et al. | 428/698 |
| 4,753,854 A | * | 6/1988 | Gavrilov et al. | 428/472 |
| 4,761,346 A | * | 8/1988 | Naik | 428/627 |
| 4,895,770 A | * | 1/1990 | Schintlmeister et al. | 428/698 |
| 4,925,346 A | * | 5/1990 | Moskowitz et al. | 407/119 |
| 5,318,840 A | * | 6/1994 | Ikeda et al. | 428/336 |
| 5,679,448 A | * | 10/1997 | Kawata | 428/699 |
| 5,882,777 A | * | 3/1999 | Kukino et al. | 428/698 |
| 5,882,778 A | * | 3/1999 | Sugizaki et al. | 428/216 |

FOREIGN PATENT DOCUMENTS

| | | |
|---|---|---|
| JP | 10168583 | 6/1998 |
| JP | 10168584 | 6/1998 |
| JP | 10176288 | 6/1998 |
| JP | 10176289 | 6/1998 |

* cited by examiner

*Primary Examiner*—Archene Turner
(74) *Attorney, Agent, or Firm*—Notaro & Michalos P.C.

(57) ABSTRACT

So as to provide a wear-resistant workpiece, and especially a wear-resistant cutting tool, capable of realising stable cutting with a long life span thereof during high-efficiency cutting, there is provided between a wear-resistant layer system with at least one hard material layer of a compound containing titanium and aluminum and the surface of the base body of a hard metal or of a steel an intermediate layer of a material selected from the group of nitride, carbonitride, nitroboride, carbonitroboride of chromium, tantalum, zirconium or titanium.

14 Claims, 1 Drawing Sheet

WEAR-RESISTANT WORKPIECE AND METHOD FOR PRODUCING SAME

TECHNICAL FIELD

The present invention is directed on wear protecting workpieces, as especially hard metal or steel workpieces, thereby especially of tools, especially cutting tools by means of wear-resistant and thus wear-protective layer systems.

BACKGROUND OF THE INVENTION

Definitions:

A layer system as used in the present description and claims shall mean any number of layers deposited one upon the other and may be realized by a single layer too.

We understand under "hard metal" cemented carbides.

When we refer to "predominantly consisting of a material" this shall mean by at least 50 at %, especially by at least 90 at %.

The present invention relates to a workpiece which comprises a workpiece body and a wear-resistant layer system on at least a part of the surface of said workpiece body, said wear-resistant workpiece having an excellent wear resistance as concerns abrasion and oxidation resistance and adhesion of the layer system. Thereby, the workpiece is in a most preferred form a tool, and especially a cutting tool, as e.g. an end mill.

Wear-resistant layer system comprising at least one layer provided on the body surface of TiN or TiCN or the like have hitherto been widely and generally used especially for tools. However, investigations have recently been made on incorporation of Al to the hard material layer for improvements in wear resistance, thereby of abrasion resistance and of oxidation resistance. Thus, there are various cases where the effects of the addition of Al to the above mentioned hard materials has S been exploited, as shown in the Japanese Patent Publication No. 53,642/1992 and the Japanese Patent Publication No. 67,705/1993.

In these cases, however, only improvements of wear resistance of the film itself, in terms of oxidation resistance and of abrasion resistance, has been attained by addition of Al. Nevertheless, wear resistance incurs more, namely the resistance of the wear resistant layer against being peeled off the base body. i.e. adhesion.

With a recent strong tendency to increase the efficiency of cutting, the cutting speed and the feed rates for cutting tend to be increased. In such cases, the adhesion of the hard material layer, i.e. its resistance against being peeled or chipped off, becomes extremely important as a more and more dominant factor in the life span of a tool, which factor even dominates the mere abrasion resistance and oxidation resistance of the layer itself. The above mentioned known layers of hard material and containing Al are generally so high in residual compression stress that the adhesion of the layer is not satisfactory, resulting in too frequent peeling off during high efficiency cutting. This spoils the life span and reliability of the tool considerably.

Obviously, we speak of the problems encountered with cutting tools, but equal problems will arise generally at tools and even more generally at workpieces, if exposed to similar loading as cutting tools. Thus, if we refer to problems and solutions referring to cutting tools, this is valid also for other tools and more generically other workpieces similarly exposed to mechanical, thermal and chemical stress.

In order to realise stable cutting with a long life span of a tool, even during high efficiency cutting, the adhesion of the wear resistance layer system must be further enhanced.

Investigations have been made on decreasing the residual compression stress—as a root cause of deterioration in adhesion—in the hard material of the hard material layer with the target of improving thereby the adhesion, As a matter of fact, however, satisfactory results are yet to be obtained.

SUMMARY OF THE INVENTION

It is an object of the present invention to provide a wear-resistant workpiece which comprises a workpiece body a wear-resistant layer system on at least a part of said body and comprising at least one hard material layer, which is provided closest to said body said hard material layer at least predominantly consisting of at least one material selected from the group consisting of;

Nitride, carbonitride, carbonitrooxide, nitroboride and carbonitroboride of at least titanium and aluminum, which wear-resistant workpiece has an improved wear resistance with respect to abrasion resistance, oxidation resistance and, and especially, to adhesion of the wear-resistant layer system, i.e. has an improved adhesion of the hard material layer.

This object is resolved by inventively providing an intermediate layer between the body and the hard material layer which intermediate layer predominantly consists of at least one material selected from the group Nitroboride, carbonitroboride, carbonitrooxide of at least one of chromium, tantalum, zirconium, titanium, Nitride, carbonitride of at least one of chromium, tantalum, zirconium.

As a result of intensive investigation with a view of improving the adhesion of the hard material layer to the workpiece body, the inventors of the present invention have found out that the comparatively soft intermediate layer when provided under the Al-containing hard material layer, which latter has a high compression stress, absorbs and hence relaxes the high compression stress of the hard material layer. Thereby, the adhesion of the hard material layer is remarkably improved. This suggests that the high compression stress when present in the hard material layer develops a high shear stress working—without intermediate layer—in the interface between the hard material layer and the workpiece body. This shear stress is an important factor in spoiling the adhesion of the hard material layer, The inventively realized relaxation by inventively providing the intermediate layer removes this shear stress at the interface and thereby improves the adhesion of the hard material layer, In other words, it is believed that the inventively provided intermediate layer as a comparatively soft layer, interposed between the hard material layer and the body, absorbs and hence relaxes the shear stress formerly developed in the interface when the hard material layer was directly deposited on the workpiece body. Therefrom it becomes clear that the intermediate layer is to be provided generically "between" the body and the hard material layer, irrespective how many and which material layers are additionally provided between the body and the intermediate layer on one hand and the intermediate layer and the hard material layer on the other hand. Nevertheless, it is preferred, with one exception of a metal layer as discussed below, to interpose the intermediate layer directly to the hard material layer and the body surface.

The object of still further improving wear resistance of the inventive wear-resistant workpiece is resolved by the present invention in that the intermediate layer and/or the hard material layer consists of at least one material selected from nitroborides, carbonitroborides.

As for the conditions required for the intermediate layer it has been recognised that not only softness, but also comparatively coarse crystal grains are favorable for stress relaxation. A better surface roughness of the intermediate layer favorably results in an improvement of adhesion. Although elucidation of other factors leading to further improvements require further studies, it has been found out that the best results are realized with the above mentioned intermediate layer materials.

It has also been confirmed, that addition of boron to the hard material and/or intermediate layer, and especially to the latter, leads to a further remarkable improvement in respect of surface roughness and provides even more favorable results with respect to adhesion of the hard material layer, Elucidation of this phenomenon may also require further studies.

Whereas conventional examples of intermediate layers make use of intermediate layer material predominantly consisting of TiN, TiCN or TiC, the present studies made by the inventors of the present invention however have shown that these well-known materials first of all involve formation of a layer having a rough surface and fine crystal grains, but which is not very effective in absorbing and relaxing shear stress as being not sufficiently soft. They result in a notably lower effect of improving adhesion as compared with the intermediate layer of the inventively proposed materials.

In a preferred form, the workpiece comprises a hard material layer of TiAlN and an intermediate layer of nitroboride or of carbonitroboride of titanium, further preferably directly interposed between body and hard material layer or realized with an additional metal layer as outlined below.

It is namely a further object of the present invention to still additionally improve wear resistance of the workpiece being provided with the inventive intermediate layer.

This is accomplished in that the workpiece further comprises a metal layer which is interposed between the base body and the intermediate layer. Thereby, in a most preferred form of realisation, the metal layer predominantly consists of at least one of chromium, tantalum, titanium and zirconium and, further preferred, predominantly consists of the same metal which is provided as a component in the inventively provided intermediate layer.

The inventors of the present invention have thereby recognised that the shear stress of the inventive workpiece can be further relaxed by providing a soft metal layer under the intermediate layer. This is based on the fact that a metal layer is high in absorption energy, low in Young's Modulus and easy of shift of dislocation and is thereby additionally effective in absorbing strain energy. Thereby, in a preferred form the workpiece comprises a hard material layer of TiAlN and an intermediate layer of nitroboride or of carbonitroboride of titanium, and further a metal layer interposed between the body and the intermediate layer which at least predominantly consists of at least one of chromium, tantalum, zirconium or titanium, further preferably of chromium and/or titanium, preferred of chromium or titanium. It is thereby preferred to directly interpose the metal layer to the body and the intermediate layer, latter being provided just adjacent the hard material layer.

As a result, peeling off of the hard material layer is inventively suppressed, even in intermittent heavy cutting at a feed rate exceeding 0.4 mm per blade, whereby stable cutting can be realized. As was mentioned above, the inventive workpiece in all its embodiments has preferably a workpiece body of a hard metal or of a steel as of a high-speed steel. It is thereby preferably realized as a tool and especially as a cutting tool.

For the thickness of the intermediate layer, d, there preferably prevails:

$$0.05 \, \mu m \leq d \leq 5 \, \mu m.$$

This is based on the following reasons:

When the thickness of the inventively provided intermediate layer is not at least 0.05 $\mu$m, it may be ineffective in relaxing the stress, i.e. in improving the adhesion of the hard material layer. On the other hand, when the thickness d of the intermediate layer exceeds 5 $\mu$m the abrasion resistance of the hard material layer may be spoiled.

With respect to the metal layer which is—in a preferred form of realisation—provided at the inventive workpiece, the thickness $d_m$ of such metal layer is preferably selected to be $$5 \, nm \leq d_m \leq 500 \, nm.$$

This in based on the following reasons:

If on one hand the thickness of the metal layer interposed between the intermediate layer and the base body is not at least 5 nm, it may likewise be ineffective in further relaxing the stress, i.e. in improving the adhesion of the hard material layer. On the other hand, when it exceeds 500 nm, plastic deformation may be developed in this metal layer during cutting, resulting in spoiling the adhesion of the hard material layer.

It is a further object of the present invention to provide a method for producing a wear-resistant workpiece, which results in such workpiece with significantly improved wear resistance. This method comprises the steps of depositing above the surface of the body of the workpiece an intermediate layer predominantly consisting of at least one material selected from the group of Nitroboride, carbonitroboride, carbonitrooxide of at least one of chromium, tantalum, titanium, zirconium, Nitride, carbonitride of at least one of chromium, tantalum, zirconium and then depositing above said intermediate layer a wear-resistant layer system by depositing above said intermediate layer a hard material layer predominantly of at least one material selected from the group of Nitride, carbonitride, carbonitrooxide, nitroboride and carbonitroboride of titanium and aluminum, thereby depositing the intermediate layer as well as the hard material layer by means of a vacuum coating process.

EXAMPLES AND FURTHER DESCRIPTION OF THE INVENTION

The invention will now be additionally described by means of figures and especially of examples. In the figures there show.

Figure 1:
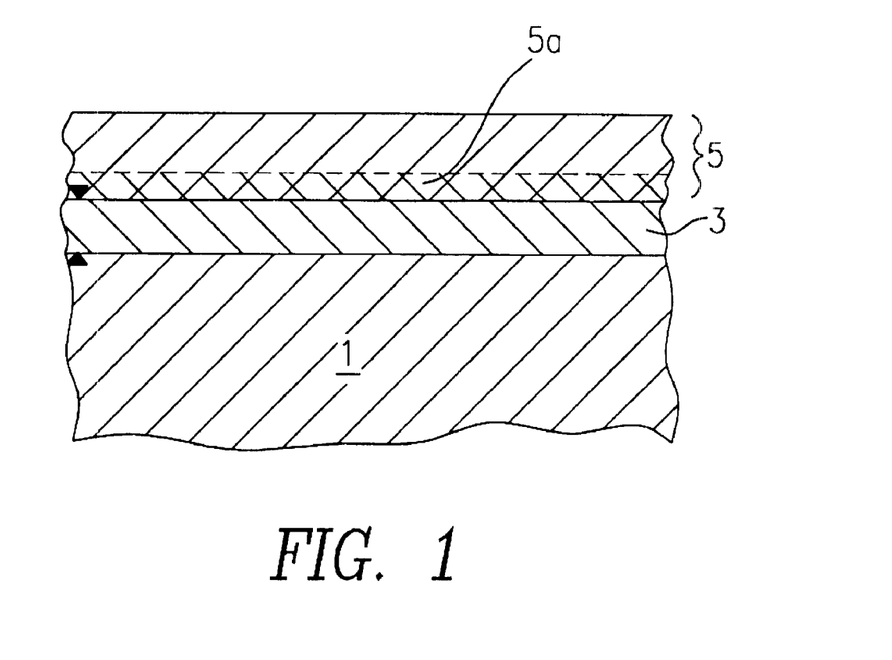
FIG. 1 a schematic representation of a wear-resistant part of an inventive workpiece in a first embodiment.

According to FIG. 1, the inventive workpiece comprises a body 1 which is preferably made of a hard metal or possibly of a steel as e.g. of a high-speed steel HSS. Deposited above and preferably on at least a surface area selected on the workpiece body 1, there is provided, by a vacuum coating process, an intermediate layer 3, preferably with a thickness d for which there is valid:

$$0.05\ \mu m \leq d \leq 5\ \mu m.$$

This intermediate layer is made of at least one material as specified above.

Thereby, the intermediate layer is at least predominantly, preferably practically exclusively, made of one of nitroboride, carbonitroboride of at least one of chromium, tantalum, zirconium, titanium, nitride, carbonitride of at least one of chromium, tantalum, zirconium. In a preferred embodiment the intermediate layer 3 is at least predominantly made of a material selected from nitroborides, carbonitrides of at least one, preferably of one of chromium, tantalum, zirconium or titanium, thereby preferably of titanium.

Deposited above, preferably on the surface of the intermediate layer 3 there is provided, preferably again by a vacuum coating process, a wear-resistant layer system 5, which may consist of one single layer or by more than one layer. Irrespective whether system 5 consists of one or of more than one layer, there is provided a lowest-most hard material layer 5a, which is made of a material as specified above.

The thickness of the wear-resistant layer system 5, be it single-layered or be it multi-layered, is considerably larger than the thickness of the intermediate layer 3.

Figure 2:
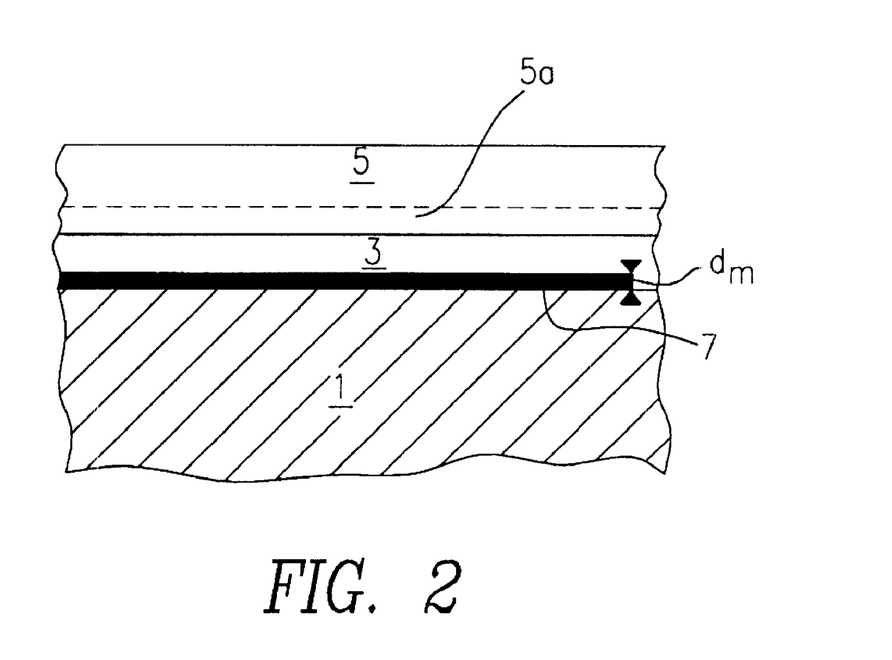
FIG. 2 a second embodiment of the wear-resistant part of the inventive workpiece in a further improved embodiment.

In FIG. 2 an improved embodiment of the present invention is shown, which departs from the embodiment according to FIG. 1 and wherein for the same parts as described with the help of FIG. 1 the same reference numbers are used. The difference with respect to the embodiment of FIG. 1 is that—again preferably by a vacuum coating step—there is applied a metal layer 7 between the surface of the base body 1 and the intermediate layer 3, preferably directly interposed an shown in FIG. 2. Thereby, the thickness of the metal layer 7, $d_m$, is generically about ten times smaller than the thickness of the intermediate layer 3. Thus, $d_m$ is preferably provided with a thickness $$5\ nm \leq d_m \leq 500\ nm.$$

The metal of the metal layer 7 is selected as specified above. Thereby, in a preferred embodiment for the metal layer 7 the same metal is selected as provided in the intermediate layer 3. Thus, e.g. if the intermediate layer 3 consists of a compound as specified just with chromium, then chromium will preferably be selected as metal of the metal layer 7. In a further preferred form chromium or titanium is selected as metal of the metal layer 7.

Experiments

1 Experiments Conducted on Tools Construed According to the Embodiment of FIG. 1

1.1.1 to 1.1.4, end mills

Hard metal end mills were prepared on an experimental basis according to the embodiment of FIG. 1. For depositing the intermediate layer and the hard material layer a small-sized arc ion plating apparatus was used. In some examples boron was added to either the intermediate layer or the hard material layer by using a target-metal containing boron added thereto. For adding in some examples carbon to the intermediate layer acetylene gas was used as a reactive gas for ion plating. The thickness of the hard material layer was selected to be 2 $\mu$m.

In the following Tables 1.1.1 to 1.1.4 "First Layer" defines for the intermediate layer and "Second Layer" stands for the hard material layer.

Under "Coating Conditions" these Tables define for the coating conditions for depositing especially the intermediate layer.

Arrows in the respective fields of the Table mean that there is valid the indication of the next upper Table-field.

The examples numbers 1 to 8 respectively are examples according to the present invention and according to the embodiment of FIG. 1, whereas the examples numbers 9 to 12 are, for comparison purposes, prior art examples. The Tables 1.1.1 to 1.1.4 stand for:

Table 1.1.1: zirconium as metal of the compound of the intermediate layer.

Table 1.1.2: tantalum as metal of the compound of the intermediate layer.

Table 1.1.3: chromium as metal of the compound of the intermediate layer.

Table 1.1.4: titanium as metal of the compound of the intermediate layer.

TABLE 1.1.1

| | Coating Conditions | | | | |
|---|---|---|---|---|---|
| | Bias Voltage | Degree of Vacuum | Film | | Milling Length At Time of Peeling |
| Sample No. | (V) | mbar | First Layer | Second Layer | (m) |
| Present Invention | | | | | |
| 1 | 70 | 1 × 10⁻² | ZrN | 0.1 $\mu$  Ti$_{0.5}$Al$_{0.5}$N | 15.2 |
| 2 | ↑ | ↑ | ZrN | 1.0 $\mu$  ↑ | 20 m without peeling |
| 3 | ↑ | ↑ | ZrN | 4.0 $\mu$  ↑ | 8.4 |
| 4 | ↑ | ↑ | ZrB$_{0.1}$N$_{0.9}$ | 0.1 $\mu$  ↑ | 18.5 |
| 5 | ↑ | ↑ | ZrC$_{0.1}$B$_{0.1}$N$_{0.8}$ | 1.0 $\mu$  ↑ | 14.7 |
| 6 | ↑ | ↑ | ZrB$_{0.4}$N$_{0.6}$ | 1.0 $\mu$  ↑ | 12.0 |
| 7 | ↑ | ↑ | ZrN | 1.0 $\mu$  Ti$_{0.5}$Al$_{0.5}$B$_{0.1}$N$_{0.9}$ | 16.8 |
| 8 | ↑ | ↑ | ZrN | 1.0 $\mu$  Ti$_{0.5}$Al$_{0.5}$B$_{0.3}$N$_{0.7}$ | 12.4 |
| Comp. Ex. | | | | | |
| 9 | ↑ | ↑ | free | Ti$_{0.5}$Al$_{0.5}$B$_{0.1}$N$_{0.9}$ | 1.8 |
| 10 | ↑ | ↑ | free | Ti$_{0.5}$Al$_{0.5}$N | 0.5 |
| 11 | ↑ | ↑ | TiN | 0.1 $\mu$  ↑ | 4.4 |
| 12 | ↑ | ↑ | TiN | 1.0 $\mu$  Ti$_{0.5}$Al$_{0.5}$B$_{0.1}$N$_{0.9}$ | 3.7 |

TABLE 1.1.2

| Sample No. | Coating Conditions | | Film | | Milling Length At Time of Debonding (m) |
|---|---|---|---|---|---|
| | Bias Voltage (V) | Degree of Vacuum mbar | First Layer | Second Layer | |
| Present Invention | | | | | |
| 1 | 70 | $1 \times 10^{-2}$ | TaN | 0.1 μ $Ti_{0.5}Al_{0.5}N$ | 12.1 |
| 2 | ↑ | ↑ | TaN | 1.0 μ ↑ | 14.3 |
| 3 | ↑ | ↑ | TaN | 4.0 μ ↑ | 7.8 |
| 4 | ↑ | ↑ | $TaB_{0.1}N_{0.9}$ | 0.1 μ ↑ | 13.2 |
| 5 | ↑ | ↑ | $TaC_{0.1}B_{0.1}N_{0.8}$ | 1.0 μ ↑ | 12.7 |
| 6 | ↑ | ↑ | $TaB_{0.4}N_{0.6}$ | 1.0 μ ↑ | 10.3 |
| 7 | ↑ | ↑ | TaN | 1.0 μ $Ti_{0.5}Al_{0.5}B_{0.1}N_{0.9}$ | 11.1 |
| 8 | ↑ | ↑ | TaN | 1.0 μ $Ti_{0.5}Al_{0.5}B_{0.3}N_{0.7}$ | 9.4 |
| Comp. Ex. | | | | | |
| 9 | ↑ | ↑ | free | $Ti_{0.5}Al_{0.5}B_{0.1}N_{0.9}$ | 1.8 |
| 10 | ↑ | ↑ | free | $Ti_{0.5}Al_{0.5}N$ | 0.5 |
| 11 | ↑ | ↑ | TiN | 0.1 μ ↑ | 4.4 |
| 12 | ↑ | ↑ | TiN | 1.0 μ $Ti_{0.5}Al_{0.5}B_{0.1}N_{0.9}$ | 3.7 |

TABLE 1.1.3

| Sample No. | Coating Conditions | | Film | | Milling Length At Time of Peeling (m) |
|---|---|---|---|---|---|
| | Bias Voltage (V) | Degree of Vacuum mbar | First Layer | Second Layer | |
| Present Invention | | | | | |
| 1 | 70 | $1 \times 10^{-2}$ | CrN | 0.1 μ $Ti_{0.5}Al_{0.5}N$ | 16.0 |
| 2 | ↑ | ↑ | CrN | 1.0 μ ↑ | 20 m without peeling |
| 3 | ↑ | ↑ | CrN | 4.0 μ ↑ | 9.5 |
| 4 | ↑ | ↑ | $CrB_{0.1}N_{0.9}$ | 0.1 μ ↑ | 20 m without peeling |
| 5 | ↑ | ↑ | $CrC_{0.1}B_{0.1}N_{0.8}$ | 1.0 μ ↑ | 15.7 |
| 6 | ↑ | ↑ | $CrB_{0.4}N_{0.6}$ | 1.0 μ ↑ | 13.2 |
| 7 | ↑ | ↑ | CrN | 1.0 μ $Ti_{0.5}Al_{0.5}B_{0.1}N_{0.9}$ | 18.2 |
| 8 | ↑ | ↑ | CrN | 1.0 μ $Ti_{0.5}Al_{0.5}B_{0.3}N_{0.7}$ | 14.6 |
| Comp. Ex. | | | | | |
| 9 | ↑ | ↑ | free | $Ti_{0.5}Al_{0.5}B_{0.1}N_{0.9}$ | 1.8 |
| 10 | ↑ | ↑ | free | $Ti_{0.5}Al_{0.5}N$ | 0.5 |
| 11 | ↑ | ↑ | TiN | 0.1 μ ↑ | 4.4 |
| 12 | ↑ | ↑ | TiN | 1.0 μ $Ti_{0.5}Al_{0.5}B_{0.1}N_{0.9}$ | 3.7 |

TABLE 1.1.4

| Sample No. | Coating Conditions | | Film | | Milling Length At Time of Peeling (m) |
|---|---|---|---|---|---|
| | Bias Voltage (V) | Degree of Vacuum mbar | First Layer | Second Layer | |
| Present Invention | | | | | |
| 1 | 70 | $1 \times 10^{-2}$ | $TiB_{0.05}N_{0.95}$ | 0.1 μ $Ti_{0.5}Al_{0.5}N$ | 18.9 |
| 2 | ↑ | ↑ | $TiB_{0.1}N_{0.9}$ | 1.0 μ ↑ | 20 m without peeling |
| 3 | ↑ | ↑ | $TiB_{0.1}N_{0.9}$ | 4.0 μ ↑ | 16.8 |
| 4 | ↑ | ↑ | $TiB_{0.2}N_{0.8}$ | 0.1 μ ↑ | 20 m without peeling |
| 5 | ↑ | ↑ | $TiC_{0.1}B_{0.1}N_{0.8}$ | 1.0 μ ↑ | 20 m without peeling |
| 6 | ↑ | ↑ | $TiB_{0.4}N_{0.6}$ | 1.0 μ ↑ | 16.9 |
| 7 | ↑ | ↑ | $TiB_{0.1}N_{0.9}$ | 1.0 μ $Ti_{0.5}Al_{0.5}B_{0.1}N_{0.9}$ | 0 m without peeling |
| 8 | ↑ | ↑ | $TiB_{0.1}N_{0.9}$ | 1.0 μ $Ti_{0.5}Al_{0.5}B_{0.3}N_{0.7}$ | 18.7 |

TABLE 1.1.4-continued

| | Coating Conditions | | Film | | Milling Length At Time of Peeling |
|---|---|---|---|---|---|
| Sample No. | Bias Voltage (V) | Degree of Vacuum mbar | First Layer | Second Layer | (m) |
| Comp. Ex. | | | | | |
| 9 | ↑ | ↑ | free | $Ti_{0.5}Al_{0.5}B_{0.1}N_{0.9}$ | 1.8 |
| 10 | ↑ | ↑ | free | $Ti_{0.5}Al_{0.5}N$ | 0.5 |
| 11 | ↑ | ↑ | TiN | 0.1 μ ↑ | 4.4 |
| 12 | ↑ | ↑ | TiN | 1.0 μ $Ti_{0.5}Al_{0.5}B_{0.1}N_{0.9}$ | 3.7 |

Milling Test

The following milling test was carried out using the inventive and conventional end mills under Tables 1.1.1 to 1.1.4;
end mill: φ8 mm with six blades
material milled; SKD11 HRC60
milling speed: 40 m/min
feed rate: 0.05 mm/blade
bite: 12mm×0.8 mm
cutting oil; dry milling Milling was carried out until peeling occurred. The milling length at the time of at least 0.05 mm-wide hard material layer peeling on a flank or a phase is also shown in the respective Tables 1.1.1 to 1.1.4. As is apparent from all Tables 1.1.1 to 1.1.4, end mills with nitride- or boron-nitride-based intermediate layer show a good hard material layer adhesion, allowing stable milling, even during milling of very hard steel, as of the mentioned HRC60-steel. Further, it may be noted that adding boron to either the intermediate layer or to the hard material layer further increases the milling length, as especially shown by the experiments according to Tables 1.1.1 to 1.1.3, whereas for titanium according to Table 1.1.4 especially adding boron to the intermediate layer led to outstanding milling lengths.

1.2.1 to 1.2.4 Inserts

Hard metal inserts corresponding to JIS P40 were coated according to the embodiment of FIG. 1 and again on experimental basis by making use of a small-sized arc ion plating apparatus. For adding boron or carbon it was proceeded as explained under 1.1.1 to 1.1.4.

The thickness of the hard material layer was selected to be 3 μm. The following Tables 1.2.1 to 1.2.4 accord in structure with the Tables 1.1.1 to 1.1.4.

Examples numbers 13 to 20 accord with the present invention, examples 21 to 24 are again, for comparison purposes, examples according to prior art.

The Tables define for:
Table 1.2.1: intermediate layer with zirconium an metal of the compound.
Table 1.2.2i intermediate layer with tantalum as metal of the compound.
Table 1.2.3; intermediate layer with chromium as metal of the compound.
Table 1.2.4: intermediate layer with titanium as metal of the compound.

TABLE 1.2.1

| | Coating Conditions | | Film | | Milling Life Span |
|---|---|---|---|---|---|
| Sample No. | Bias Voltage (V) | Degree of Vacuum mbar | First Layer | Second Layer | (m) |
| Present Invention | | | | | |
| 13 | 50 | 1 × 10⁻² | ZrN | 0.1 μ $Ti_{0.5}Al_{0.5}N$ | 4.23 |
| 14 | ↑ | ↑ | ZrN | 1.0 μ ↑ | 5.18 |
| 15 | ↑ | ↑ | ZrN | 4.0 μ ↑ | 3.01 |
| 16 | ↑ | ↑ | $ZrB_{0.1}N_{0.9}$ | 0.1 μ ↑ | 6.11 |
| 17 | ↑ | ↑ | $ZrC_{0.1}B_{0.1}N_{0.8}$ | 1.0 μ ↑ | 5.45 |
| 18 | ↑ | ↑ | $ZrB_{0.3}N_{0.7}$ | 1.0 μ ↑ | 3.78 |
| 19 | ↑ | ↑ | ZrN | 1.0 μ $(Ti_{0.3}Al_{0.7})(B_{0.1}N_{0.9})$ | 7.02 |
| 20 | ↑ | ↑ | ZrN | 1.0 μ $(Ti_{0.3}Al_{0.7})(B_{0.3}N_{0.7})$ | 4.21 |
| Comp. Ex. | | | | | |
| 21 | ↑ | ↑ | free | $Ti_{0.5}Al_{0.5}N$ | 0.56 |
| 22 | ↑ | ↑ | free | $(Ti_{0.3}Al_{0.7})(B_{0.1}N_{0.9})$ | 0.69 |
| 23 | ↑ | ↑ | TiN | 0.1 μ $Ti_{0.5}Al_{0.5}N$ | 1.21 |
| 24 | ↑ | ↑ | TiN | 1.0 μ ↑ | 1.87 |

TABLE 1.2.2

| Sample No. | Coating Conditions | | Film | | Milling Life Span (m) |
|---|---|---|---|---|---|
| | Bias Voltage (V) | Degree of Vacuum mbar | First Layer | Second Layer | |
| Present Invention | | | | | |
| 13 | 50 | $1 \times 10^{-2}$ | TaN | $0.1 \mu$  $Ti_{0.5}Al_{0.5}N$ | 4.02 |
| 14 | ↑ | ↑ | TaN | $1.0 \mu$  ↑ | 5.28 |
| 15 | ↑ | ↑ | TaN | $4.0 \mu$  ↑ | 3.11 |
| 16 | ↑ | ↑ | $TaB_{0.1}N_{0.9}$ | $0.1 \mu$  ↑ | 6.43 |
| 17 | ↑ | ↑ | $TaC_{0.1}B_{0.1}N_{0.8}$ | $1.0 \mu$  ↑ | 4.98 |
| 18 | ↑ | ↑ | $TaB_{0.3}N_{0.7}$ | $1.0 \mu$  ↑ | 3.99 |
| 19 | ↑ | ↑ | TaN | $1.0 \mu$  $(Ti_{0.3}Al_{0.7})(B_{0.1}N_{0.9})$ | 5.97 |
| 20 | ↑ | ↑ | TaN | $1.0 \mu$  $(Ti_{0.3}Al_{0.7})(B_{0.3}N_{0.7})$ | 3.79 |
| Comp. Ex. | | | | | |
| 21 | ↑ | ↑ | free | $Ti_{0.5}Al_{0.5}N$ | 0.56 |
| 22 | ↑ | ↑ | free | $(Ti_{0.3}Al_{0.7})(B_{0.1}N_{0.9})$ | 0.69 |
| 23 | ↑ | ↑ | TiN | $0.1 \mu$  $Ti_{0.5}Al_{0.5}N$ | 1.21 |
| 24 | ↑ | ↑ | TiN | $1.0 \mu$  ↑ | 1.87 |

TABLE 1.2.3

| Sample No. | Coating Conditions | | Film | | Milling Life Span (m) |
|---|---|---|---|---|---|
| | Bias Voltage (V) | Degree of Vacuum mbar | First Layer | Second Layer | |
| Present Invention | | | | | |
| 13 | 50 | $1 \times 10^{-2}$ | $TiB_{0.1}N_{0.9}$ | $0.1 \mu$  $Ti_{0.5}Al_{0.5}N$ | 5.32 |
| 14 | ↑ | ↑ | $TiB_{0.1}N_{0.9}$ | $1.0 \mu$  ↑ | 7.11 |
| 15 | ↑ | ↑ | $TiB_{0.1}N_{0.9}$ | $4.0 \mu$  ↑ | 5.11 |
| 16 | ↑ | ↑ | $TiB_{0.1}N_{0.9}$ | $0.1 \mu$  ↑ | 6.55 |
| 17 | ↑ | ↑ | $TiC_{0.1}B_{0.1}N_{0.8}$ | $1.0 \mu$  ↑ | 8.87 |
| 18 | ↑ | ↑ | $TiB_{0.4}N_{0.6}$ | $1.0 \mu$  ↑ | 4.56 |
| 19 | ↑ | ↑ | $TiB_{0.1}N_{0.9}$ | $1.0 \mu$  $(Ti_{0.3}Al_{0.7})(B_{0.1}N_{0.9})$ | 10.01 |
| 20 | ↑ | ↑ | $TiB_{0.2}N_{0.81}$ | $1.0 \mu$  $(Ti_{0.3}Al_{0.7})(B_{0.3}N_{0.7})$ | 5.69 |
| Comp. Ex. | | | | | |
| 21 | ↑ | ↑ | free | $Ti_{0.5}Al_{0.5}N$ | 0.56 |
| 22 | ↑ | ↑ | free | $(Ti_{0.3}Al_{0.7})(B_{0.1}N_{0.9})$ | 0.69 |
| 23 | ↑ | ↑ | TiN | $0.1 \mu$  $Ti_{0.5}Al_{0.5}N$ | 1.21 |
| 24 | ↑ | ↑ | TiN | $1.0 \mu$  ↑ | 1.87 |

TABLE

| Sample No. | Coating Conditions | | Film | | Milling Life Span (m) |
|---|---|---|---|---|---|
| | Bias Voltage (V) | Degree of Vacuum mbar | First Layer | Second Layer | |
| Present Invention | | | | | |
| 13 | 50 | $1 \times 10^{-2}$ | CrN | $0.1 \mu$  $Ti_{0.5}Al_{0.5}N$ | 4.56 |
| 14 | ↑ | ↑ | CrN | $1.0 \mu$  ↑ | 5.73 |
| 15 | ↑ | ↑ | CrN | $4.5 \mu$  ↑ | 3.96 |
| 16 | ↑ | ↑ | $CrB_{0.1}N_{0.9}$ | $0.1 \mu$  ↑ | 7.41 |
| 17 | ↑ | ↑ | $CrC_{0.1}B_{0.1}N_{0.8}$ | $1.0 \mu$  ↑ | 6.77 |
| 18 | ↑ | ↑ | $CrB_{0.3}N_{0.7}$ | $1.0 \mu$  ↑ | 4.06 |
| 19 | ↑ | ↑ | CrN | $1.0 \mu$  $(Ti_{0.3}Al_{0.7})(B_{0.1}N_{0.9})$ | 7.21 |
| 20 | ↑ | ↑ | CrN | $1.0 \mu$  $(Ti_{0.3}Al_{0.7})(B_{0.3}N_{0.7})$ | 4.33 |

TABLE-continued

| | Coating Conditions | | | | Milling Life Span |
|---|---|---|---|---|---|
| | Bias Voltage | Degree of Vacuum | Film | | |
| Sample No. | (V) | mbar | First Layer | Second Layer | (m) |
| Comp. Ex. | | | | | |
| 21 | ↑ | ↑ | free | $Ti_{0.5}Al_{0.5}N$ | 0.56 |
| 22 | ↑ | ↑ | free | $(Ti_{0.3}Al_{0.7})(B_{0.1}N_{0.9})$ | 0.69 |
| 23 | ↑ | ↑ | TiN 0.1 μ | $Ti_{0.5}Al_{0.5}N$ | 1.21 |
| 24 | ↑ | ↑ | TiN 1.0 μ | ↑ | 1.87 |

Milling test

The following milling test was performed on the specimen according to the Tables 1.2.1. to 1.2.4 to find the milling length attained till peeling off the hard material layer:
insert: SEE42TN corresponding to JIS P40
material milled: SKD61 HRC42
milling speed: 160 m/min
feed rate: 0.1 mm/blade
bite: 2 mm
lubrication dry milling As is apparent from all Tables 1.2.1 to 1.2.4 all nitride- or boron nitride-based intermediate layers led to good milling life and thus to good adhesion of the hard material layer, so as to realise very stable milling, even when milling high-hardness steel like HRC42. Any insert was disabled as soon as hard material layer peeling or chipping off occurred. Thus, there arose extreme life span differences between conventionally and inventively coated inserts.

Further, addition of boron to either the intermediate layer material or the hard material layer further improved life span of the inserts.

2. Experiments Conducted on Tools Construed According to the Embodiment of FIG. 2

2.1 to 2.4

Hard metal tools corresponding to JIS P40 were inventively coated according to the embodiment of FIG. 2 with a metal layer (first layer), then the intermediate layer (second layer), and finally with the hard material layer (third layer). Experimental coating was again performed with a small-sized arc ion plating apparatus, where boron and carbon were for some examples added, as was explained in context with Tables 1.1.1 to 1.1.4.

The thickness of the hard material coating was again selected to be 3 μm. Again, the following Tables 2.1. to 2.4 are structured as the previous ones.

The metal layer according to FIG. 2 was deposited from the respective metal target without reactive gas.

In the respective Tables again the milling length attained until hard material coating peeling and chipping occurred is indicated as life span of the respective tool. The Tables define for:

Table 2.1; Metal layer and compound of intermediate layer based on zirconium.

Table 2.2: Metal layer and compound of intermediate layer based on tantalum.

Table 2.3: Metal layer and compound of intermediate layer based on titanium.

Table 2.4. Metal layer and compound of intermediate layer based on chromium.

TABLE 2.1

| | Sample No. | Coating Layer | | | | | Milling Length till Chipping (m) |
|---|---|---|---|---|---|---|---|
| | | First Layer | | Second Layer | | Third Layer | |
| Present Invention | 25 | Zr | 5 nm | ZrN | 1.0μ | $Ti_{0.5}Al_{0.5}N$ | 12.3 |
| | 26 | Zr | 50 nm | ZrN | 1.0μ | ↑ | 11.5 |
| | 27 | Zr | 200 nm | ZrN | 1.0μ | ↑ | 9.6 |
| | 26 | Zr | 400 nm | ZrN | 1.0μ | ↑ | 6.7 |
| | 29 | Zr | 50 nm | $ZrB_{0.1}N_{0.9}$ | 1.0μ | ↑ | 13.4 |
| Comp. Ex. | 30 | free | | free | | ↑ | 0.83 |
| | 31 | free | | TiN | 1.0μ | ↑ | 1.21 |
| | 32 | free | | TiN | 0.3μ | ↑ | 2.45 |

TABLE 2.2

| | Sample No. | Coating Layer | | | | | Milling Length till Chipping (m) |
|---|---|---|---|---|---|---|---|
| | | First Layer | | Second Layer | | Third Layer | |
| Present Invention | 25 | Ta | 5 nm | TaN | 1.0μ | $Ti_{0.5}Al_{0.5}N$ | 12.3 |
| | 26 | Ta | 50 nm | TaN | 1.0μ | ↑ | 10.1 |
| | 27 | Ta | 200 nm | TaN | 1.0μ | ↑ | 8.9 |
| | 28 | Ta | 400 nm | TaN | 1.0μ | ↑ | 7.7 |
| | 29 | Ta | 50 nm | $TaB_{0.1}N_{0.9}$ | 1.0μ | ↑ | 12.9 |

TABLE 2.2-continued

| Sample No. | | First Layer | Second Layer | | Third Layer | Milling Length till Chipping (m) |
|---|---|---|---|---|---|---|
| Comp. Ex. | 30 | free | free | | ↑ | 0.83 |
| | 31 | free | TiN | 1.0μ | ↑ | 1.21 |
| | 32 | free | TiN | 0.3μ | ↑ | 2.45 |

TABLE 2.3

| Sample No. | | First Layer | | Second Layer | | Third Layer | Milling Length till Chipping (m) |
|---|---|---|---|---|---|---|---|
| Present | 25 | Ti | 5 nm | $TiB_{0.1}N_{0.9}$ | 1.0μ | $Ti_{0.5}Al_{0.5}N$ | 16.2 |
| Invention | 26 | Ti | 50 nm | $TiB_{0.1}N_{0.9}$ | 1.0μ | ↑ | 13.8 |
| | 27 | Ti | 200 nm | $TiB_{0.1}N_{0.9}$ | 1.0μ | ↑ | 13.3 |
| | 28 | Ti | 400 nm | $TiB_{0.1}N_{0.9}$ | 1.0μ | ↑ | 11.4 |
| | 29 | Ti | 50 nm | $TiB_{0.1}N_{0.9}$ | 1.0μ | ↑ | 19.2 |
| Comp. Ex. | 30 | free | | free | | ↑ | 0.83 |
| | 31 | free | | TiN | 1.0μ | ↑ | 1.21 |
| | 32 | free | | TiN | 0.3μ | ↑ | 2.45 |

TABLE 2.4

| Sample No. | | First Layer | | Second Layer | | Third Layer | Milling Length till Chipping (m) |
|---|---|---|---|---|---|---|---|
| Present | 25 | Cr | 5 nm | CrN | 1.0μ | $Ti_{0.5}Al_{0.5}N$ | 14.3 |
| Invention | 26 | Cr | 50 nm | CrN | 1.0μ | ↑ | 12.6 |
| | 27 | Cr | 200 nm | CrN | 1.0μ | ↑ | 10.9 |
| | 28 | Cr | 400 nm | CrN | 1.0μ | ↑ | 9.8 |
| | 29 | Cr | 50 nm | $CrB_{0.1}N_{0.9}$ | 1.0μ | ↑ | 15.4 |
| Comp. Ex. | 30 | free | | free | | ↑ | 0.83 |
| | 31 | free | | TiN | 1.0μ | ↑ | 1.21 |
| | 32 | free | | TiN | 0.3μ | ↑ | 2.45 |

It is apparent from all Tables 2.1 to 2.4 that interposition of a respective metal layer recognizably improves the life span of the respective tool.

The coating conditions which are not established in Tables 2.1 to 2.4 were established as defined in the respective Tables 1.2.1 to 1.2.4.

According to the present invention there is thus realized a cutting tool for stable cutting with a long life span of the tool, even during high-efficiency cutting, while a decrease in residual compression stress is probably the reason of reducing peeling and chipping of the hard material wear-resistant layer or layer system, which system per se ensures protection of the tool or workpiece against abrasion and oxidation.

What is claimed is:

1. A wear-resistant workpiece comprising:
   a workpiece body;
   a wear-resistant layer system on at least a part of said body and comprising at least one hard material layer provided closest to said body;
   said hard material layer at least predominantly consisting of at least one material selected from the group consisting of:
      nitride, carbonitride, carbonitrooxide, nitroboride and carbonitroboride of both titanium and aluminum; and
   an intermediate layer between said body and said hard material layer, said intermediate layer at least predominantly consisting of at least one material selected from the group
      nitroboride, carbonitroboride and carbonitrooxide of at least
      one of chromium, tantalum, zirconium and titanium; and
      nitride and carbonitride of at least one of chromium, tantalum and zirconium,
   the intermediate layer being softer than the hard material layer to absorb and relax high compression stress of the hard material layer and reduce shear stress.

2. The workpiece of claim 1, wherein at least one of said hard material layer and of said intermediate layer at least predominantly consists of at least one material selected from said nitroborides and carbonitroborides.

3. The workpiece of claim 1, wherein said body is of a hard metal or of a steel, as of HSS steel.

4. The workpiece of claim 1, being a tool.

5. The workpiece of claim 4, being a cutting tool.

6. The workpiece of claim 1, wherein thickness of said intermediate layer, d, is selected to be:

0.05 µm ≦ d ≦ 5 µm.

7. The workpiece of claim 1, further comprising a metal layer interposed between said base body and said intermediate layer.

8. The workpiece of claim 7, said metal layer being of at least one of chromium, tantalum, titanium, zirconium.

9. The workpiece of claim 8, wherein said metal layer consisting of the same metal provided in said intermediate layer.

10. The workpiece of claim 7, wherein said metal layer has a thickness $d_m$ which is selected to be 5 nm ≦ $d_m$ ≦ 500 nm.

11. The workpiece of claim 1, wherein said hard material layer at least predominantly consists of TiAlN and said intermediate layer of nitroboride or of carbonitroboride of titanium.

12. The workpiece of claim 11, further comprising a metal layer interposed between said base body and said intermediate layer, said layer being at least predominantly of at least one of chromium, tantalum, zirconium or titanium.

13. The workpiece of claim 12, said metal layer being of chromium and/or titanium.

14. A wear-resistant workpiece comprising:

a workpiece body;

a wear-resistant layer system on at least a part of said body and comprising at least one hard material layer provided closest to said body;

said hard material layer at least predominantly consisting of at least one material selected from the group consisting of: nitride, carbonitride, carbonitrooxide, nitroboride and carbonitroboride of both titanium and aluminum; and an intermediate layer between said body and said hard material layer, said intermediate layer at least predominantly consisting of at least one material selected from the group nitroboride, carbonitroboride and carbonitrooxide of at least one of chromium, tantalum, zirconium and titanium; and nitride and carbonitride of at least one of chromium, tantalum and zirconium.

* * * * *